United States Patent [19]
Yang et al.

[11] Patent Number: 6,091,613
[45] Date of Patent: Jul. 18, 2000

[54] SEMICONDUCTOR MEMORY DEVICE HAVING A MULTI-STEP PULSE GENERATION CIRCUIT

[75] Inventors: Tae Hum Yang, Seoul; Chae Hyun Jung, Kyungsangbuk-Do, both of Rep. of Korea

[73] Assignee: Hyundai Electronics Industries Co., Ltd., Kyungki-Do, Rep. of Korea

[21] Appl. No.: 09/294,349

[22] Filed: Apr. 20, 1999

[30] Foreign Application Priority Data

Apr. 21, 1998 [KR] Rep. of Korea ............... 98-14196

[51] Int. Cl.⁷ ........................................... H02M 3/18
[52] U.S. Cl. ............................................. 363/60; 307/110
[58] Field of Search ..................... 363/59, 60, 62; 307/110; 327/536, 540

[56] References Cited

U.S. PATENT DOCUMENTS

| | | | |
|---|---|---|---|
| 5,168,174 | 12/1992 | Naso et al. | 327/536 X |
| 5,563,824 | 10/1996 | Miyawaki et al. | 365/185.18 |
| 5,638,326 | 6/1997 | Hollmer et al. | 365/185.2 |
| 5,719,807 | 2/1998 | Sali et al. | 365/185.25 |

FOREIGN PATENT DOCUMENTS

| | | |
|---|---|---|
| 6-176585 | 6/1994 | Japan . |
| 6-314495 | 11/1994 | Japan . |
| 9-22598 | 1/1997 | Japan . |

*Primary Examiner*—Jessica Han
*Attorney, Agent, or Firm*—Pennie & Edmonds LLP

[57] ABSTRACT

A voltage generation circuit of a semiconductor memory device has a charge pump circuit for supplying a voltage required to operate the semiconductor memory device; a voltage divide circuit having a plurality of capacitors and connected to the output of the charge pump circuit to divide the output of the charge pump circuit; an initialization means for discharging charges charged to the plurality of capacitors according to a reset signal; and a differential amplifier for controlling the charge pump circuit according to the result of comparison of the voltage divide circuit and a reference voltage.

18 Claims, 4 Drawing Sheets

SEMICONDUCTOR MEMORY DEVICE HAVING A MULTI-STEP PULSE GENERATION CIRCUIT

BACKGROUND OF THE INVENTION

1. Field of the Invention

The present invention relates to a voltage generation circuit of a semiconductor memory device and, in particular, to a voltage generation circuit of a semiconductor memory device for generating a multi-step pulse.

2. Background of the Invention

In general, a variety of voltages are required at the time of operation of programming, erasing and verifying of a flash memory. For example, in case of programming a flash memory cell, a voltage of 9V is applied to a control gate electrode, a voltage of 5V to a drain, and a voltage of 0V to a source.

These voltages can be obtained by a multi-step pulse generator. The multi-step pulse generator has a charge pump, a voltage divide circuit which is connected to an output of the charge pump and to which a plurality resistors are connected in series according to a condition of switches, and a differential amplifier for controlling the output of the charge pump according to an output of the voltage divide circuit. A voltage outputted from the voltage divide circuit and a reference voltage $V_{REF}$ are compared at the differential amplifier, and according to the result, the charge pump performs a pumping operation in multi-step and generates the multi-step pulse.

However, the voltage generation circuit described above has a problem in that the reliability of the semiconductor memory device is degraded since a leakage current can occur through a plurality of resistors and whereby a ripple can occur to the output voltage of the charge pump.

SUMMARY OF THE INVENTION

Therefore, the object of the present invention is to provide a voltage generation circuit of a semiconductor memory device which can eliminate the disadvantage described above by suppressing the generation of leakage current by constructing a voltage divide circuit with a plurality of capacitors and switches.

The present invention to accomplish the above described object comprises a voltage generation circuit of a semiconductor memory device comprising:

a charge pump circuit for supplying a voltage required to operate the semiconductor memory device;

a voltage divide circuit having a plurality of capacitors and connected to the output of the charge pump circuit to divide the output of the charge pump circuit;

an initialization means for discharging charges charged to the plurality of capacitors according to a reset signal; and a differential amplifier for controlling the charge pump circuit according to the result of comparison of the voltage divide circuit and a reference voltage.

BRIEF DESCRIPTION OF THE DRAWINGS

The above object and other advantages of the present invention will become more apparent by describing in detail the preferred embodiment of the present invention with reference to the attached drawings in which.

Similar reference characters refer to similar parts in the several views of the drawings.

DETAILED DESCRIPTION OF THE INVENTION

The present invention will be described below in detail with reference to the accompanying drawings.

Figure 1:
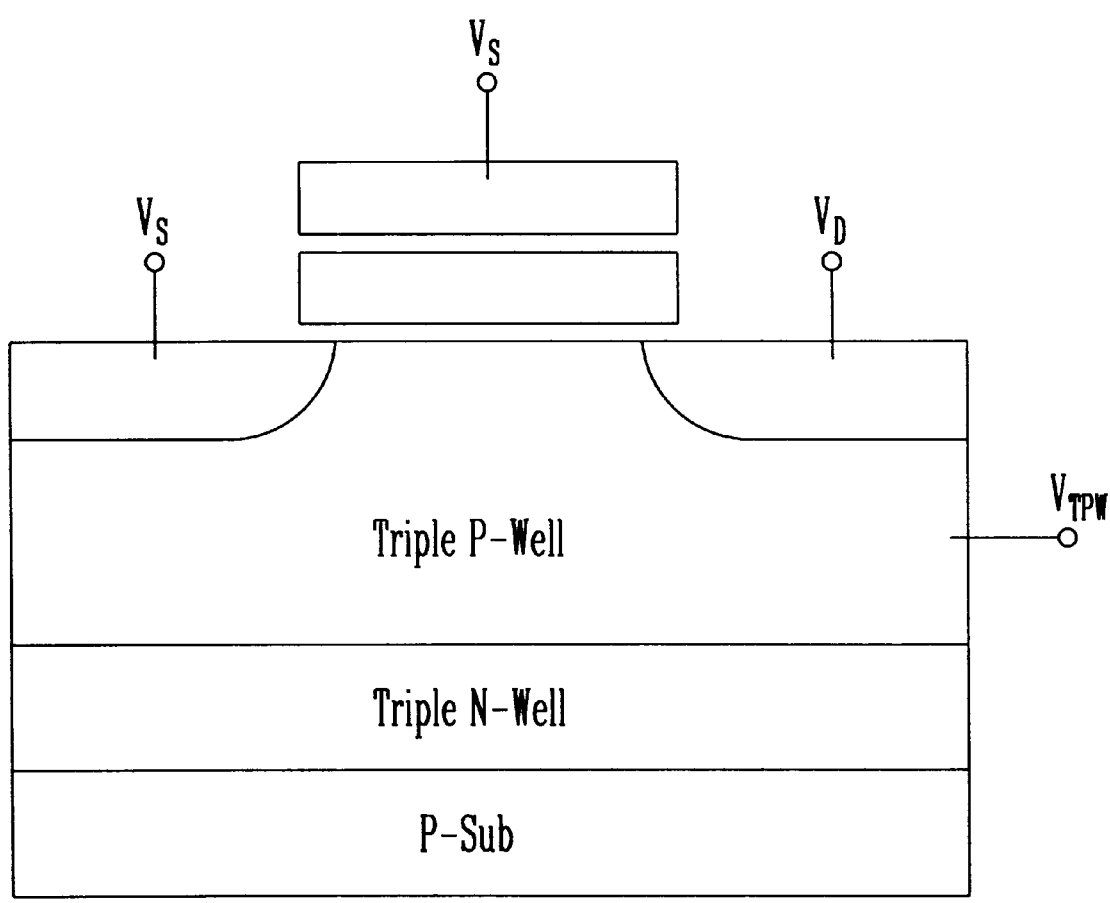
FIG. 1 is a sectional view of a stack gate type flash EEPROM cell.

FIG. 1 is a sectional view of a stack gate type flash EEPROM cell, and a voltage condition required for operation of this cell is shown in Table 1.

As can be seen in FIG. 1 and Table 1, in case where the programming operation is performed, a voltage of 9V is applied to a gate, 5V to a drain, 0V to a source, and 0V to a triple P-well. In case where the erasing operation is performed, a voltage of −8V is applied to the gate, the drain and source are maintained to a floating condition, and a voltage from 3.5V to 8V is applied to the triple P-well with a spacing of 0.5V. In case where the reading operation is performed, a power source voltage Vcc is applied to the gate, 1V to the drain, 0V to the source and triple P-well. In case where the program verifying operation is performed, a voltage of 6V is applied to the gate, 1V to the drain, 0V to the source and the triple P-well. On the other hand, the voltage applied to a triple N-well is same as that applied to the triple P-well.

TABLE 1

|  | $V_G$ | $V_D$ | $V_S$ | $V_{TRW}$ |
| --- | --- | --- | --- | --- |
| programming | 9V | 5 V | 0 V | 0 V |
| erasing | −8 V | floating | floating | ramp |
| reading | $V_{CC}$ | 1 V | 0 V | 0 V |
| program verification | 6V | 1 V | 0 V | 0 V |

Figure 2:
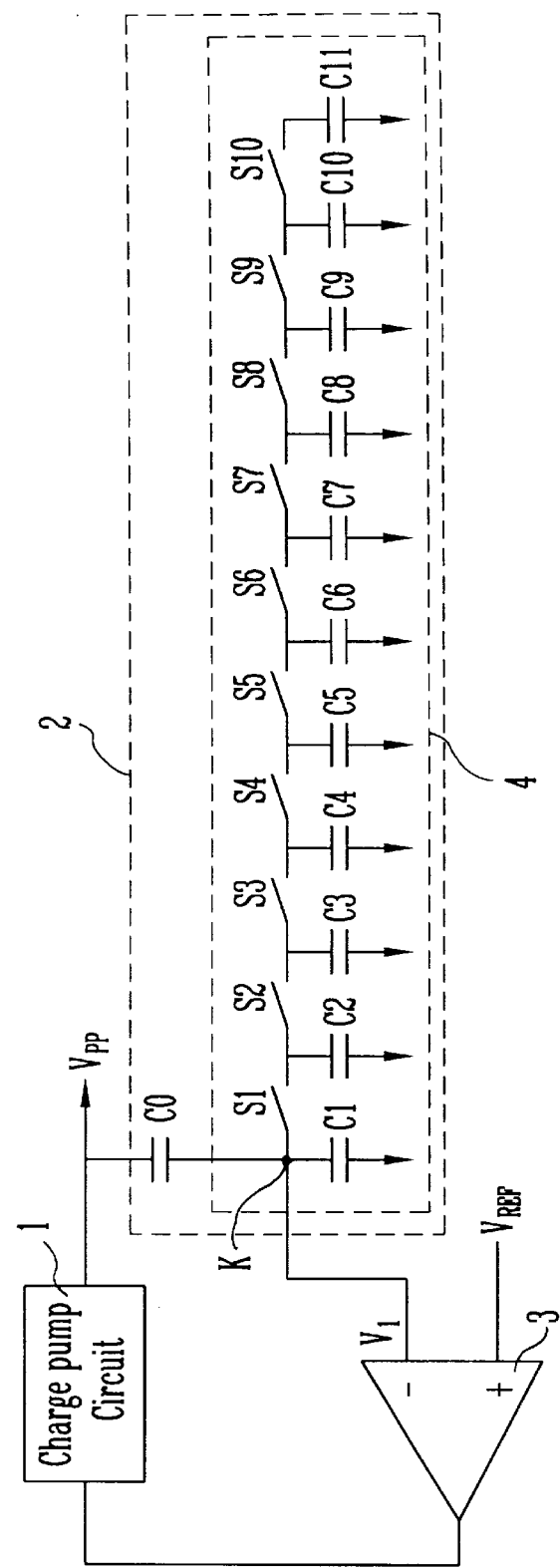
FIG. 2 is a block diagram of a voltage generation circuit of a semiconductor memory device according to the present invention.

A block diagram of the voltage generation circuit suggested by the present invention to generate such voltage is shown in FIG. 2.

Figure 4:
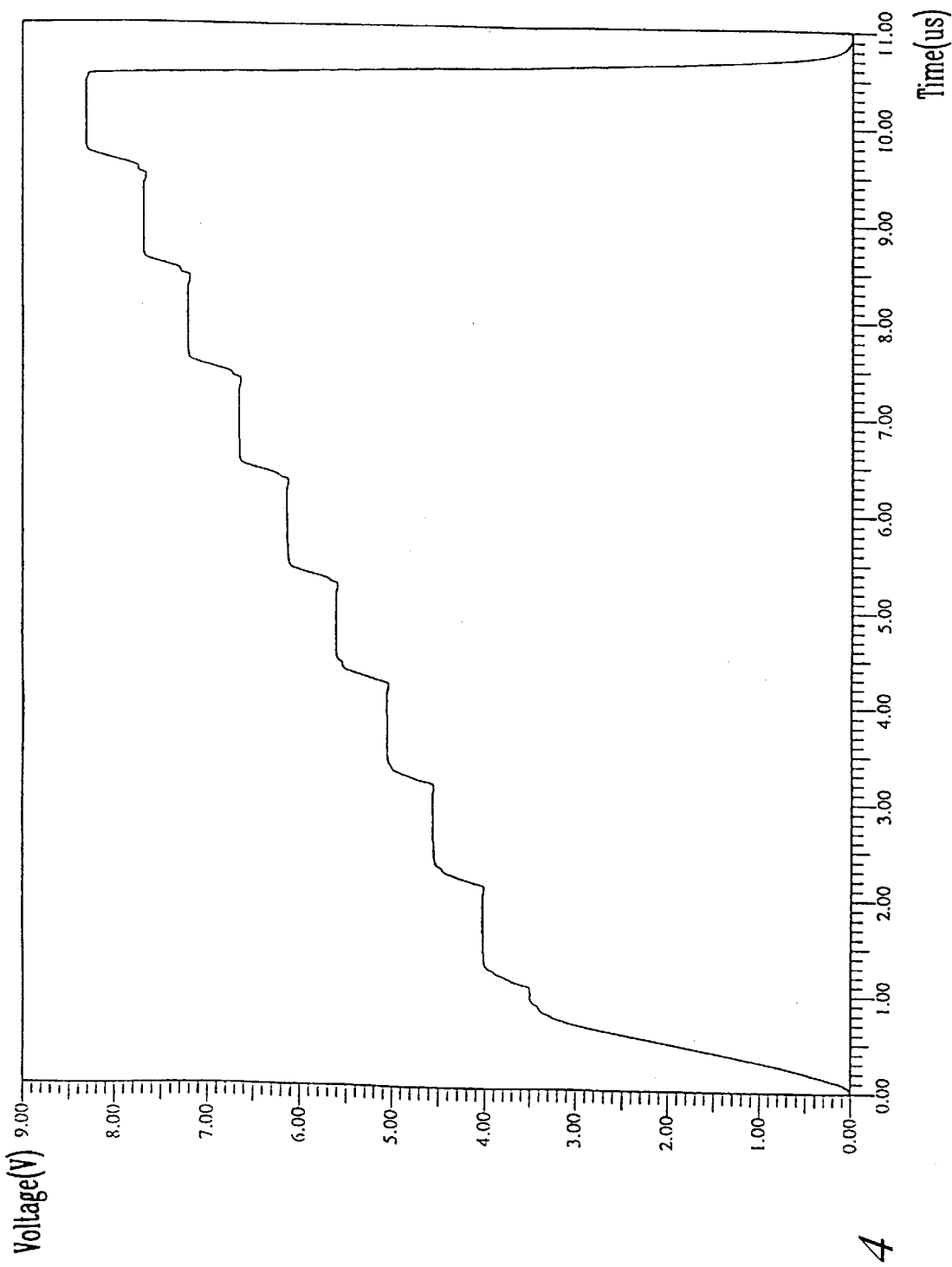
FIG. 4 is a graph showing a result of simulating the voltage generation circuit of the semiconductor memory device according to the present invention.

FIG. 2 shows a block diagram of the voltage generation circuit of the semiconductor memory device according to the present invention, and comprises a charge pump circuit 1, a voltage divide circuit 2 and a differential amplifier 3. The charge pump circuit 1 generates a multi-step pulse Vpp as shown in FIG. 4 according to the output of the differential amplifier 3. The voltage divide circuit 2 comprises a plurality of capacitors C0 to C11 and switches S1 to S10. The differential amplifier 3 controls the drive of the charge pump circuit 1 by comparing the output voltage of the voltage divide circuit 2 and a reference voltage Vref. In the voltage divide circuit 2, the capacitor C0 connected to an output terminal of the charge pump circuit 1 is connected to a in series with a capacitor block 4. The capacitor block 4 is constructed in such a way that a plurality of capacitors C1 to C11 are connected in parallel according to the condition of switches S1 to S10 connected between the capacitors.

A method of driving the voltage generation circuit of the semiconductor memory device is described below.

The charge pump circuit 1 outputs the source voltage Vpp required to drive the flash memory device. The source voltage Vpp outputted by the charge pump circuit 1 is applied to the voltage divide circuit 2 of the flash memory device. The output voltage of the charge pump circuit 1 is supplied to a node K through the capacitor C0 of the voltage divide circuit 2. The voltage of the node K is determined according to the capacitances of capacitor C0 and the capacitor block 4. That is, the capacitance of the capacitor block 4 is determined according to the number of capacitors C1 to C11 connected in parallel according to the condition of connection of switches S1 to S10. The differential amplifier 3 compares the output voltage $V_1$ of the voltage divide circuit 2 and the reference voltage $V_{REF}$ and outputs a signal which controls the charge pump circuit 1. The differential amplifier 3 stops the pumping operation of the charge pump circuit 1 in case where the output voltage $V_1$ of the voltage divide circuit 2 is larger than or equal to the reference voltage $V_{REF}$. Therefore, the output voltage $V_1$ is controlled by increasing the number of capacitors connected by combining the switches S1 to S10 of the capacitor block 4.

For example, in case where the switches S1 and S2 are simultaneously connected, the capacitors C1, C2 and C3 are connected to the node K in parallel, the voltage $V_1$ is output by the capacitor C0 and the capacitors C1, C2 and C3 of the capacitor block 4 as represented by Equation 1.

$$V_1 = \frac{C0}{C0 + C1 + C2 + C3} V_{PP} \quad \text{[Equation 1]}$$

The source voltage is obtained by Equation 2, which itself is obtained by transforming Equation 1.

$$V_{PP} = \frac{C0 + C1 + C2 + C3}{C0} V_1 \quad \text{[Equation 2]}$$

It is assumed that the reference voltage $V_{REF}$ is 2V, the capacitor C0 has the capacitance of 2.0 pF, C1 has 1.5 pF, C2 to C10 has 0.5 pF, and C11 has 1.0 pF. In addition, since a signal for controlling the charge pump circuit 1 is output from the differential amplifier 3 when the reference voltage $V_{REF}$ and the output voltage $V_1$ of the voltage divide circuit 2 both are 2V, it is assumed that the output voltage $V_1$ of the voltage divide circuit and the reference voltage $V_{REF}$ have same potential. Under this assumption, the programming, erasing and program verification operation among the operations of the flash memory device described above will now be described.

To apply a voltage of 9V to the gate to perform the programming operation among the operations of the flash memory device described above, all the switches S1 to S10 are closed. Then, since all the capacitors C1 to C11 of the capacitor block 4 are connected to the node K in parallel, the source voltage Vpp of 9V is obtained by the Equation 2, and this voltage is applied to the gate.

A method of obtaining a voltage from 3.5V to 8V with an interval of 0.5V to be applied to the triple P-well to perform the erasing operation among the operations of the flash memory device described above will be described. Only the capacitor C1 is connected to the node K by opening all the switches S1 to S10 of the capacitor block 4. Then, if the switches S1 to S9 are sequentially connected to the capacitor C0 and C1, the voltage of up to 8V can be obtained with an interval of 0.5V.

The voltage of 6V to be applied to the gate to perform the program verification operation among the operations of the flash memory device described above can be obtained by simultaneously closing the switches S1 to S5 of the capacitor block 4 so that the capactors C1 to C6 are connected to the node K in parallel. Then, by means of the capacitor C0 and the capacitors C1 to C6, the voltage of 6V can by obtained by the Equation 2.

On the other hand, a variety of voltages to be applied to the flash memory device can be obtained by adjusting the number of capacitors and switches, the capacitance of capacitors and the reference voltage.

Figure 3:
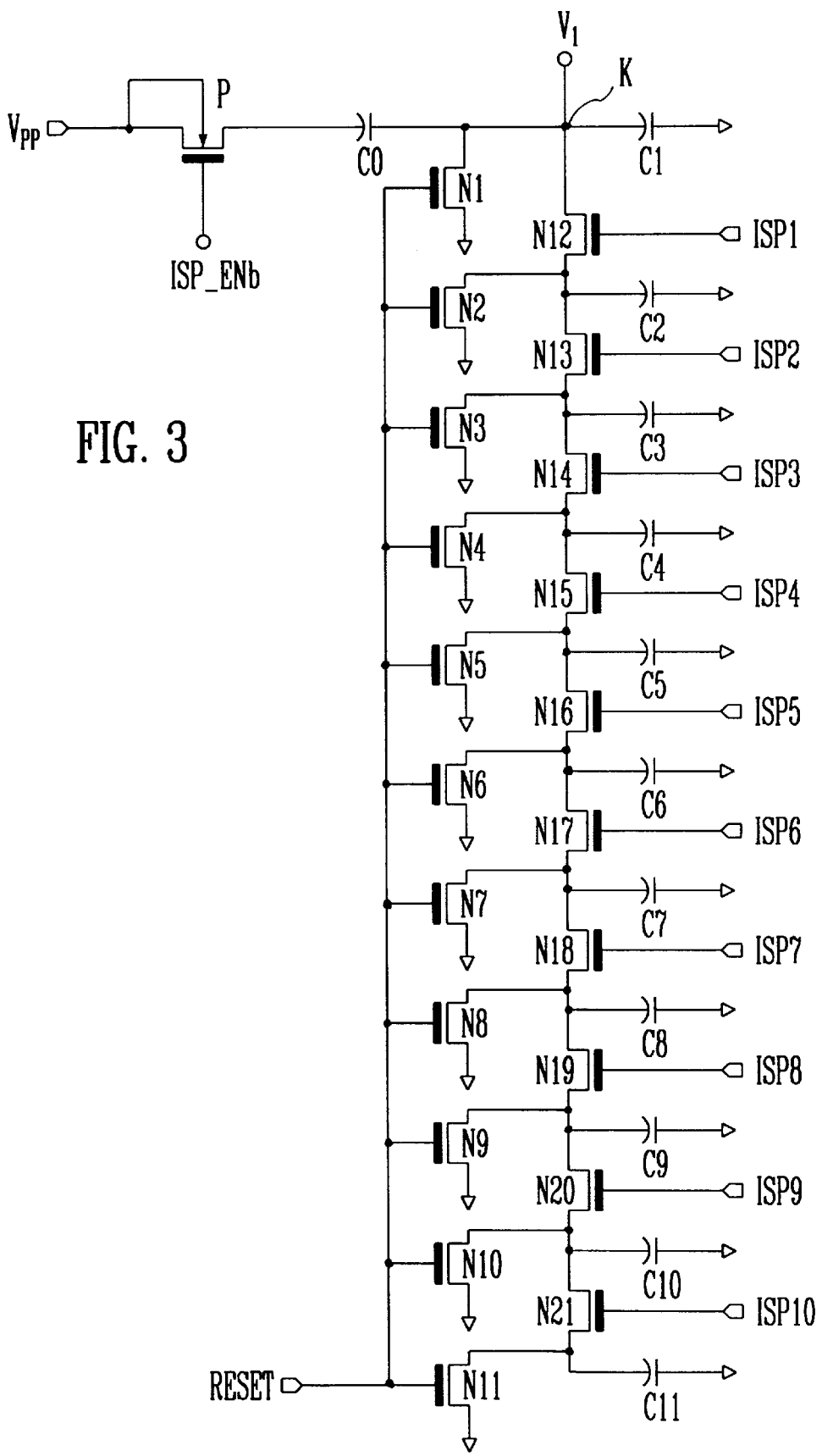
FIG. 3 is a circuit diagram showing an embodiment of a voltage divide circuit of the voltage generation circuit of the semiconductor memory device according to the present invention.

FIG. 3 is a circuit diagram showing an embodiment of the voltage divide circuit according to the present invention.

The charge pump circuit, the voltage divide circuit and the differential amplifier which constitute the voltage generation circuit are operated by an enable signal ISP_ENb of the voltage generation circuit of the semiconductor memory device. The source voltage Vpp pumped by the charge pump circuit is applied to the voltage divide circuit. A PMOS transistor P is turned on by an inverted enable signal ISP_ENb so as to apply the source voltage to the voltage divide circuit. A first to eleventh NMOS transistors N1 to N11 are turned on by a reset signal RESET of high state. Therefore, electric charge charged to all the capacitors (Here, 12 capacitors) are discharged to initialize the capacitors. A tweleveth to twenty-first NMOS transistor N12 to N21 are turned on by switching signals ISP1 to ISP10 for connecting each of the capacitors C1 to C11 constituting the capacitor block, whereby the capacitors of the capacitor block are connected to the node K.

That is, since the twelfth NMOS transistor N12 is turned on by the first switch signal ISP1 of high state so that the capacitors C1 and C2 are connected to the node K, the output voltage is adjusted by the capacitors C0, C1 and C2. As illustrated in conjunction with FIG. 2, the number of capacitors connected to the node K in parallel is adjusted by adjusting the input switching signals according to the desired voltage.

FIG. 4 is a graph showing the result of embodying and simulating the voltage generation circuit by using the circuit of FIG. 3. The graph shows the result of sequentially inputting the first to ninth switching signals ISP1 to ISP9 as a high state. It can be seen from the graph that as the number of capacitors connected by the switching signals increases, the output voltage is increased without an influence of ripple.

As described above, according to the present invention, since the voltage without leakage current can be output from the voltage divider circuit, the possibility of ripple at the charge pump circuit can be eliminated, whereby the reliable drive of the semiconductor memory device can be realized.

What is claimed is:

1. A voltage generation circuit of a semiconductor memory device comprising:

a charge pump circuit for supplying a voltage required to operate said semiconductor memory device;

a voltage divide circuit having a plurality of capacitors and being connected to an output of said charge pump circuit to divide the output of said charge pump circuit;

an initialization means for discharging charges charged to said plurality of capacitors according to a reset signal; and a differential amplifier for controlling said charge pump circuit according to the result of comparison of said voltage divide circuit and a reference voltage, wherein said voltage divide circuit comprises:

a first capacitor connected to said charge pump circuit;

a second capacitor connected between said first capacitor and ground; and a plurality of capacitors connected in parallel to both ends of said second capacitor through each of a corresponding plurality of switches.

2. A voltage generation circuit of a semiconductor memory device comprising:

a charge pump circuit for supplying a voltage required to operate said semiconductor memory device;

first and second capacitors connected in series between an output of said charge pump circuit and ground;

a plurality of capacitors connected in parallel to said second capacitor through each of a corresponding plurality of switches; and a differential amplifier for controlling said charge pump circuit according to the result of comparison of a voltage of a conjunction point of said first and second capacitors and a reference voltage.

3. The circuit of claim 2, wherein each of said switches comprises a transistor.

4. The circuit of claim 2, further comprising an initialization means for initializing said capacitors according to a reset signal.

5. A voltage generation circuit of a semiconductor memory device comprising:

a charge pump circuit for supplying a voltage required to operate said semiconductor memory device;

a first and second capacitors connected in series between an output of said charge pump circuit and ground;

a plurality of transistors which are connected between a conjunction point of said first and second capacitors and a first conjunction point and which are respectively turned on by a corresponding input control signal;

a plurality of capacitors each connected between ground and each conjunction point between said transistors; and a differential amplifier for controlling said charge pump according to the result of comparison of a voltage of said conjunction point of said first and second capacitors and a reference voltage.

6. The circuit of claim 5, further comprising an initialization means for initializing said capacitors according to a reset signal.

7. A semiconductor memory device having a voltage generation circuit, said voltage generation circuit comprising:

a charge pump circuit for supplying a supply voltage;

first and second capacitors connected in series between an output of said charge pump circuit and ground;

at least one capacitor selectively connected in parallel across said second capacitor through a first switch; and a differential amplifier for controlling said charge pump circuit according to the result of comparison of a voltage of a conjunction point of said first and second capacitors and a reference voltage.

8. The semiconductor memory device of claim 7, comprising a plurality of capacitors selectively connected in parallel across said second capacitor via a corresponding plurality of switches.

9. The semiconductor memory device of claim 8, wherein each of said plurality of switches is controlled by a corresponding input control signal, and said plurality of switches and capacitors are configured such that each successive member of said plurality of capacitors is connected to said second capacitor via all preceding switches.

10. The semiconductor memory device of claim 7, further comprising an initialization circuit arranged to provide a reset signal to initialize said capacitors.

11. The semiconductor memory device of claim 10, wherein the initialization circuit comprises at least one transistor.

12. The semiconductor memory device of claim 11, wherein the initialization circuit comprises one transistor for each of said plurality of capacitors.

13. A voltage generation circuit of a semiconductor memory device, said voltage generation circuit comprising:

a charge pump circuit for supplying a supply voltage to the semiconductor memory device;

first and second capacitors connected in series between an output of said charge pump circuit and ground;

at least one capacitor selectively connected in parallel across said second capacitor through a first switch; and a differential amplifier for controlling said charge pump circuit according to the result of comparison of a voltage of a conjunction point of said first and second capacitors and a reference voltage.

14. The circuit of claim 13, comprising a plurality of capacitors selectively connected in parallel across said second capacitor via a corresponding plurality of switches.

15. The circuit of claim 14, wherein each of said plurality of switches is controlled by a corresponding input control signal, and said plurality of switches and capacitors are configured such that each successive member of said plurality of capacitors is connected to said second capacitor via all preceding switches.

16. The circuit of claim 13, further comprising an initialization circuit arranged to provide a reset signal to initialize said capacitors.

17. The circuit of claim 16, wherein the initialization circuit comprises at least one transistor.

18. The circuit of claim 17, wherein the initialization circuit comprises one transistor for each of said plurality of capacitors.

* * * * *